United States Patent [19]

Scofield

[11] Patent Number: 5,243,498
[45] Date of Patent: Sep. 7, 1993

[54] MULTI-CHIP SEMICONDUCTOR MODULE AND METHOD FOR MAKING AND TESTING

[75] Inventor: Robert J. Scofield, Tempe, Ariz.

[73] Assignee: Motorola, Inc., Schaumburg, Ill.

[21] Appl. No.: 887,949

[22] Filed: May 26, 1992

[51] Int. Cl.$^5$ .............................................. H05K 7/12
[52] U.S. Cl. .................................. 361/767; 174/259; 174/255; 257/781; 257/690; 361/728; 361/778; 361/785
[58] Field of Search ............... 361/410, 392, 400, 403, 361/404, 406, 418, 414, 421; 174/255, 258, 259; 324/158 F; 257/690, 781, 693

[56] References Cited

U.S. PATENT DOCUMENTS 5,088,008  2/1992  Takeyama et al. .................. 361/403
5,151,771  9/1992  Hiroi et al. ............................ 357/70

Primary Examiner—Leo P. Picard
Assistant Examiner—Young S. Whang
Attorney, Agent, or Firm—Joe E. Barbee

[57] ABSTRACT

A multi-chip semiconductor module (10,20) includes a plurality of semiconductor chips (13,13') mounted on a substrate (11) and a plurality of conductive vias (16) extending through the substrate (11). A conductive network (17) formed on the substrate and a plurality of leads (19) are mounted to edges of the substrate (11) and extend away from the substrate (11). Each of the leads (19) is electrically coupled to a contact pad (14) of an integrated circuit chip (13,13'), and each conductive vias (16) has a first end coupled to the conductive network (17) and a second end exposed on the bottom surface of the substrate (11) allowing electrical access to many of the contact pads (14) of the integrated circuit (13,13').

10 Claims, 2 Drawing Sheets

MULTI-CHIP SEMICONDUCTOR MODULE AND METHOD FOR MAKING AND TESTING

BACKGROUND OF THE INVENTION

The present invention relates, in general, to multi-chip semiconductor modules, and more particularly, to a multi-chip semiconductor module designed for thorough testability.

Multi-chip semiconductor modules are complex combinations of integrated circuit chips mounted on a one or more substrates. The integrated circuit chips are interconnected on the substrate by an conductive network formed on the substrate. Each of the integrated circuits has a plurality of contact pads formed thereon, and some of these contact pads are coupled to leads which extend from the package. The substrate, integrated circuit chips, and leads form a single package which can perform functions vastly more complex than a single integrated circuit chip. Moreover, because the integrated circuit chips are mounted to a single substrate, the entire assembly is very space efficient, requiring less board space in an apparatus using the multi-chip semiconductor module.

Reliability of multi-chip modules is very important to manufacturers and users. Complete functional testing of the integrated circuits used, particularly high speed testing and testing after burn-in are fundamental techniques to ensure reliability. It is particularly difficult to test multi-chip modules because only some of the contact pads of the integrated circuits can be coupled to an external tester by way of leads which extend from the package. Testing is further complicated by the fact that it is difficult or impossible to test the integrated circuit chips fully before they are mounted to the substrate. Moreover, once the individual integrated circuit chips are connected to each other, their characteristics are modified; parasitics created by the interconnection become difficult, if not impossible, to measure. Testing is particularly difficult at high speeds. Thus, functionality of the integrated circuit chips inside the multi-chip module cannot be completely tested because there is no way to couple a tester to individual contact pads on the integrated circuits.

What is needed is a multi-chip module designed for testability and a method for making and testing such a multi-chip module.

SUMMARY OF THE INVENTION

Briefly stated, the present invention is achieved by a multi-chip semiconductor module having a plurality of semiconductor chips mounted a substrate and a plurality of conductive vias extending through the substrate. A plurality of leads are mounted to edges or a surface of the substrate and extend away from the substrate. Each of the leads is electrically coupled to a contact pad of an integrated circuit chip. A conductive network is formed on a top surface of the substrate and each conductive via has a first end coupled to the conductive network and a second end exposed on the bottom surface of the substrate. The conductive network is coupled to the contact pads by wire bonding or solder bump bonding allowing electrical access to many of the contact pads of the integrated circuit.

DETAILED DESCRIPTION OF THE DRAWINGS

Figure 1:
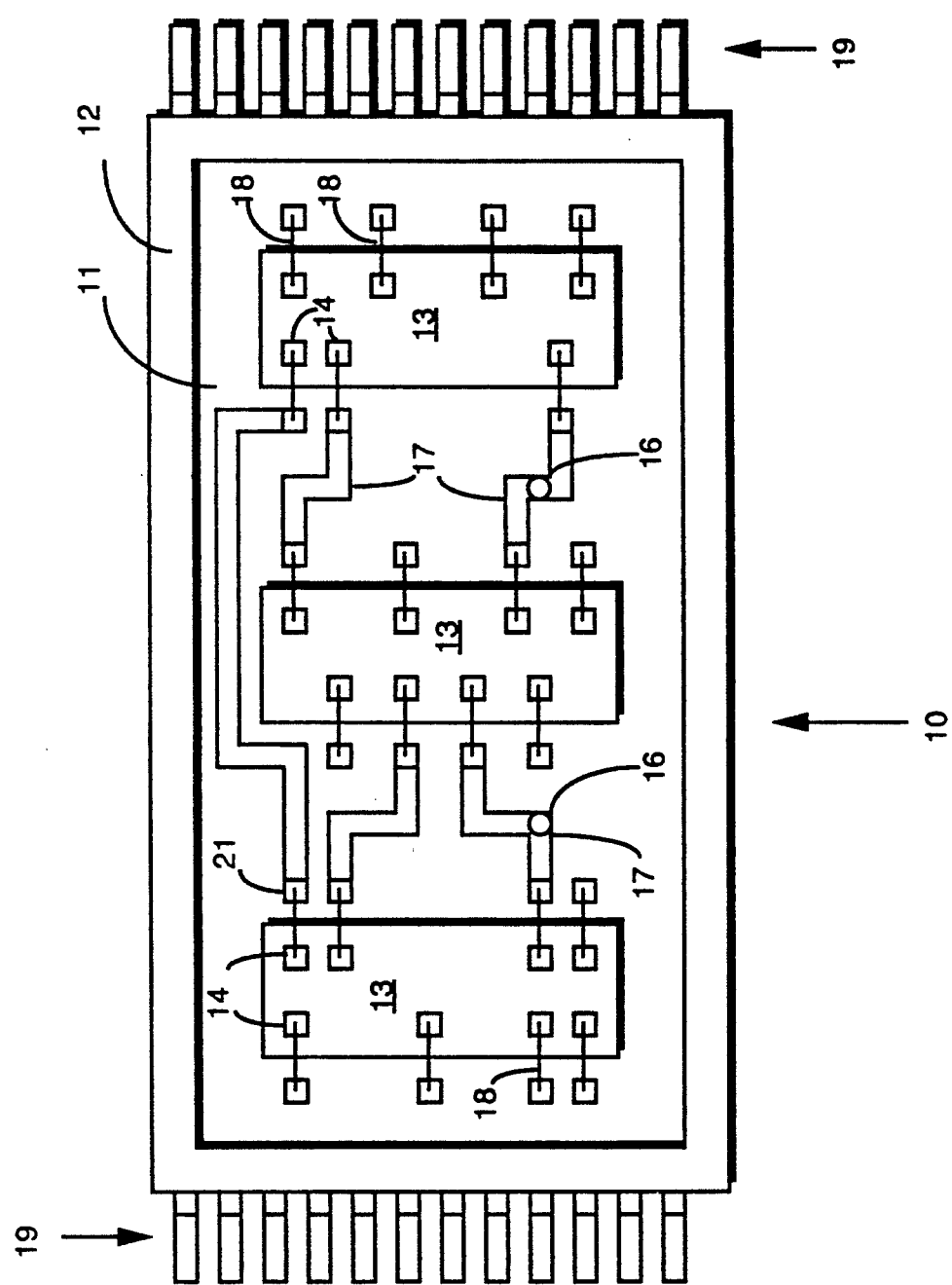
FIG. 1 is a highly simplified top view of a multi-chip module in accordance with the present invention.

FIG. 1 illustrates a highly simplified top view of a multi-chip module 10 in accordance with the present invention. Substrate 11 preferably comprises one or more layers of ceramic, but other dielectric materials may also be useful. A conductive interconnect network 17 is formed on the top surface and interlayers of substrate 11 using well known techniques. A seal ring 12 is provided at an edge of substrate 11, and extends upward from the plane of substrate 11 to support a module cover or lid (not shown) as is more apparent in FIGS. 2-3.

For ease of description, conductive interconnect network 17 is illustrated as a single interconnect layer positioned on the upper surface of substrate 11 is shown, but it should be understood that substrate 11 usually comprises multiple layers of ceramic with an interconnect layer formed on the upper surface of each layer. As used herein, the term "substrate" includes multiple layer substrates, and the term "conductive network" includes multiple interconnect layers, each formed on one layer of the multiple layer substrate.

Conductive network 17 includes several bond pads 21 which are terminals for conductive network 17. A plurality of integrated circuit chips 13 are mounted on a substrate 11. Chips 13 are mounted to substrate 11 by epoxy bonding, solder bonding, or other similar methods which are well known in the semiconductor industry. A plurality of contact pads 14 are formed on each integrated circuit chip 13 and are used to electrically couple to integrated circuits 13. For example some of contact pads 14 carry power to an integrated circuit 13, while other contact pads conduct signals to and from an integrated circuit 13. In the example shown in FIG. 1, contact pads 14 are electrically coupled to bond pads 21 of conductive network 17 by wire bonds 18.

Wire bonding is only one example of a means for electrically connecting contact pads 14 to bond pads 21. Another common interconnect is provided by "flip-chip" technology where metallic bumps, often comprising solder, are formed on contact pads 14 and chip 13 is mounted top side down so that the bumps align to and are soldered to predetermined bonding pads 21. This process is also known as solder bump bonding. For ease of illustration and understanding, "flip-chip" bonding is not shown in FIG. 1, but is illustrated in greater detail in FIGS. 2-3.

An important feature of the present invention is conductive vias 16. Vias 16 pass through the one or more layers of substrate 11. As shown at the top surface of substrate 11 in FIG. 1, each conductive via 16 electrically couples to conductive network 17 at a predetermined location. Other conductive vias 22 (shown in FIGS. 2-3) may be located near an edge or periphery of substrate 11, and used to make electrical connection between selected bond pads 21 and leads 19. Leads 19 are mounted to the bottom surface of substrate 11 or may protrude from the edge of substrate 11 when mounted to an intermediate layer of a multiple layer substrate 11. Alternatively, leads 19 may be mounted to the top surface of substrate 11, in which case electrical connection to leads 19 is achieved by wire bonding, solder bump bonding, or the like.

Manufacturers often mount a number of integrated circuit chips 13 on a "prepatory" substrate (not shown) to form a subassembly during manufacturing. This prepatory substrate may itself have one or more interconnect networks formed therein, and a number of contact pads for coupling power and signals to the individual integrated circuits mounted on the prepatory substrate. When a prepatory substrate is used, it is treated and processed in essentially the same manner as when a single integrated circuit chip is used. Accordingly, the terms "semiconductor chip" and "integrated circuit chip" as used herein include a single integrated circuit or multiple integrated circuits mounted on a prepatory substrate.

Figure 2:
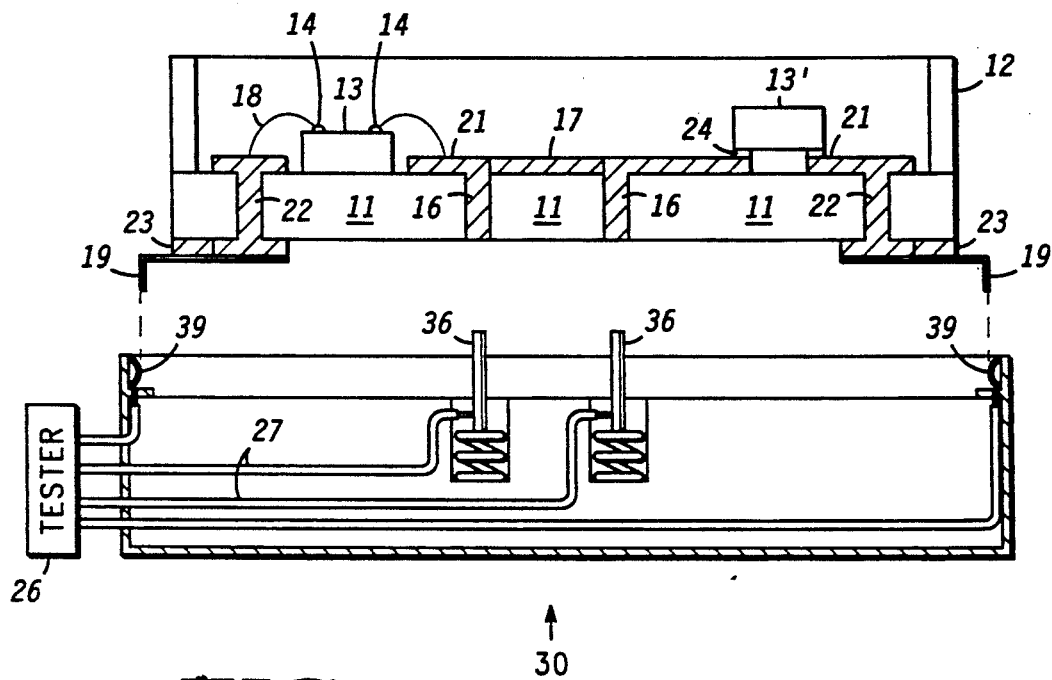
FIG. 2 is a cross-section view of a multi-chip module in accordance with the present invention during testing.

FIG. 2 illustrates a multi-chip module 20 in accordance with the present invention in cross-section. For ease of description, only two integrated circuits 13 and 13' are shown in FIG. 2, but it should be understood that in practice, tens of integrated circuits 13 may be mounted on a single substrate 11, including integrated circuits as well as passive components such as resistors, capacitors, and inductors.

Figure 3:
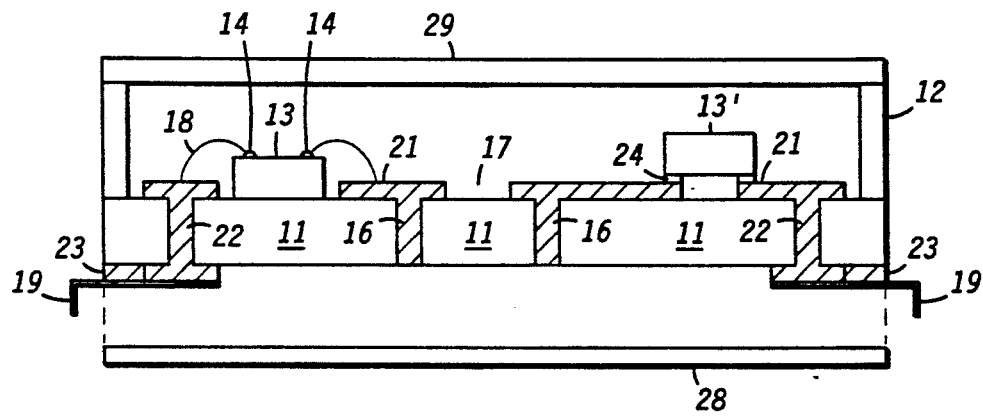
FIG. 3 is a cross-section view of a multi-chip module shown in FIG. 2 at a final stage of packaging.

It should be understood that multi-chip modules are often configured as either "cavity up" wherein semiconductor chip 13 is mounted on the bottom of the package or in a "cavity down" wherein semiconductor chip 13 is mounted on the top surface of the package. FIGS. 13 3 illustrate a cavity-up configuration, but it is a routine matter to translate this configuration into a cavity-down configuration, as is well understood in the semiconductor packaging art. In a cavity-down configuration, the bottom surface of substrate 11 shown in FIG. 2 simply becomes the top surface of multi-chip module 20, and the exposed portion of conductive vias 16 is on the top surface of module 20. The present invention is intended to cover both cavity-up and cavity-down configurations, although for ease of description the nomenclature of cavity-up structure is used.

FIG. 2 also illustrates use of solder bump bonding in chip 13' shown at the right hand side of FIG. 2. Integrated circuits 13' includes metallic bumps 24 formed on each contact pad 14 (shown in FIG. 1). Metallic bumps 24 conveniently comprise solder having tin, lead, gold, or an alloy of these materials. Chip 13' is attached top side down on substrate 11 by aligning bumps 24 with predetermined bonding pads 21. Solder bump technology is well known in the semiconductor assembly arts, and will not be described in further detail here.

Conductive vias 16 extend through substrate 11, terminating in a coupling to conductive network 17 or a bond pad 21. Where conductive network 17 comprises multiple interconnect layers, conductive vias 16 may be coupled to any of the layers. Conductive vias 16 are exposed on the bottom surface of substrate 11, and are preferably plated with gold to improve resistance to oxidation. Conductive vias 22 located near the periphery of substrate 11 illustrate one means of electrically coupling leads 19, mounted to the bottom surface of substrate 11, to bond pads 21 on the upper surface of substrate 11. Conductive vias 22 are largely similar to conductive vias 16 in construction, materials, and method of manufacture. In accordance with the present invention, the number of leads 19 is less than the total number of conductive vias 16 and 22, so that vias 16 are not coupled to leads 19 and are instead exposed at the bottom surface of substrate Il.

Testing socket 30 is used to temporarily couple multi-chip module 20 to a circuit tester during assembly. The basic features on test socket 30 are similar to conventional test sockets, including contacts 39 used to make temporary electrical coupling to leads 19. In addition to conventional contacts 39, test socket 30 includes spring mounted contact pins 36. Alternatively, spring mounted contact pins 36 may be formed using metal filled elastomers patterned to form elastic contact pins 36. Contact pins 36 are positioned in socket 30 so that each pin 36 aligns with a via 16 when multi-chip module 20 is inserted into test socket 30. The springs force pins 30 to make temporary electrical contact to the bottom of conductive vias 16. Contact pins 36 and conventional contacts 39 are coupled to tester 26 by couplings 27. Some or all of couplings 27 may be transmission lines to allow high speed signals to be conducted to vias 16.

Conductive vias allow tester 26 to communicate with integrated circuits 13 and 13' in a manner that is impossible using leads 19 alone. Any number of contact pads 14 (shown in FIG. 1) can be accessed, greatly reducing test time and allowing individual integrated circuits 13 and 13' to be functionally tested at high speed. Also, multi-chip module 20 can be burned in, that is to say operated at high temperature for a substantial time, while retaining full ability to test individual integrated circuits 13 and 13'. In some cases, individual integrated circuits 13 or 13' that fail during test or burn-in can be replaced or repaired, saving cost of discarding the entire multi-chip module 20.

After test and burn-in, the bottom surface of substrate 11, including exposed portions of vias 16, are covered by a cover 28 comprising a ceramic or other dielectric insulating material, as shown in FIG. 3. Cover 28 is attached to substrate 11 by epoxy bonding, or other known attaching techniques. Cover 28 is sized and shaped so that leads 19 still extend from multi-chip module 20. Similarly, a cap 29 comprising a metal, ceramic or other commonly used module sealing material is mounted on seal ring 12 to seal the upper portion of multi-chip module 20. Cover 28 protects the exposed portions of vias 16 and prevents contamination deposited during assembly, testing, and use from causing electrical shorts or leakage between vias 16. Ceramic cover 28 also prevents inadvertent electrical contact to vias 16 during use.

By now it should be appreciated that a multi-chip module and method for making and testing it is provided. Further, the multi-chip module in accordance with the present invention allows high frequency functional testing of individual components of the multi-chip module during assembly, test, and burn in.

I claim:

1. A multi-chip semiconductor module comprising: a ceramic substrate having a top surface and a bottom surface; a plurality of semiconductor chips mounted on the top surface, wherein each chip has a plurality of contact pads formed thereon; a first set of conductive vias passing through the substrate near a periphery of the substrate; a plurality of leads attached to the periphery of the bottom surface of the substrate, wherein each lead is electrically coupled to one of the first set of conductive vias; a conductive network formed on the top surface of the substrate, wherein the conductive network includes a number of bonding pads and some of the contact pads of the semiconductor chips are electrically coupled to the bonding pads of the conductive network; a second set of conductive vias located in a portion of the substrate, wherein each of the second set of vias is electrically coupled to the conductive network, wherein none of the second set of conductive vias is electrically coupled to one of the leads.

2. The multi-chip semiconductor module of claim 1 further comprising a dielectric cover permanently attached to the bottom surface, wherein the second set of vias are covered by the dielectric cover and the plurality of leads are not covered by the dielectric cover.

3. The multi-chip semiconductor module of claim 1 further comprising wires bonded to the bonding pads and to the contact pads.

4. The multi-chip semiconductor module of claim 1 further comprising: a metallic bump formed on each contact pad, wherein each semiconductor chip is mounted face down on the substrate and each metallic bump is aligned to a predetermined location on the conductive network.

5. A multi-chip semiconductor module comprising: a substrate having a top surface and a bottom surface; a plurality of semiconductor chips mounted on the top surface, each chip having a plurality of contact pads formed thereon; a conductive network formed on the top surface of the substrate; a plurality of leads mounted to edges of the substrate and extending away from the substrate, wherein the each of the leads are electrically coupled to one of the contact pads; and a plurality of conductive vias extending through the substrate, wherein each via has a first end coupled to the conductive network and a second end exposed on the bottom surface of the substrate.

6. The multi-chip semiconductor module of claim 5 further comprising a dielectric cover mounted to the bottom surface of the substrate and covering the second end exposed of each of the conductive vias.

7. The multi-chip semiconductor module of claim 6 wherein each of the semiconductor chips further comprises a solder bump formed on each of the contact pads, and the chip is mounted face down with the solder bumps soldered to predetermined locations of the conductive network.

8. A method of making and testing a multi-chip semiconductor module comprising the steps of: providing a substrate having a top surface and a bottom surface, wherein a plurality of conductive vias are formed through the substrate in predetermined locations; forming a conductive network on the substrate interconnecting selected vias, the conductive network including a number of bonding pads; mounting a plurality of semiconductor chips on the top surface, each chip having a plurality of contact pads formed thereon; electrically coupling each contact pad to one of the bonding pads of the conductive network; coupling a plurality of leads to the bottom surface of the substrate, wherein each lead is electrically coupled to one of the conductive vias and the number of leads is less than the number of conductive vias so that at least one conductive vias is not attached to one of the leads; testing the multi-chip module by temporarily coupling an external tester to the plurality of leads and to the at least one conductive vias that is not coupled to one of the leads; decoupling the multi-chip module from the external tester; and covering the at least one conductive vias that is not coupled to one of the leads with a dielectric cover plate.

9. The method of claim 8 further comprising the steps of: providing a metallic bump on each contact pad of at least one of the semiconductor chips; and attaching the at least one of the semiconductor chip to the conductive network by soldering the metallic bumps to predetermined locations on the conductive network.

10. The method of claim 8 further comprising plating a bottom surface of the conductive vias with gold.

* * * * *